(12) United States Patent
Van Der Avoort

(10) Patent No.: US 8,432,233 B2
(45) Date of Patent: Apr. 30, 2013

(54) MICRO-ELECTROMECHANICAL RESONATOR GEOMETRY

(75) Inventor: Casper Van Der Avoort, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/161,818

(22) Filed: Jun. 16, 2011

(65) Prior Publication Data

US 2011/0309891 A1    Dec. 22, 2011

(30) Foreign Application Priority Data

Jun. 18, 2010  (EP) .................................. 10166527

(51) Int. Cl.
*H03B 5/30* (2006.01)
*H01L 41/053* (2006.01)
*H03H 9/17* (2006.01)

(52) U.S. Cl.
USPC ........... 331/156; 310/348; 310/367; 310/370; 333/200

(58) Field of Classification Search ................ 331/154, 331/156; 310/348, 367, 370; 333/200
See application file for complete search history.

(56) References Cited

U.S. PATENT DOCUMENTS

| | | | | |
|---|---|---|---|---|
| 6,262,520 B1 * | 7/2001 | Knowles | ........................ | 310/370 |
| 6,396,201 B1 * | 5/2002 | Ide et al. | ........................ | 310/353 |
| 6,600,389 B2 * | 7/2003 | Ma et al. | ........................ | 333/186 |
| 7,368,861 B2 * | 5/2008 | Tanaya | ........................ | 310/370 |
| 7,521,846 B2 * | 4/2009 | Tanaya | ........................ | 310/370 |
| 2002/0190607 A1 | 12/2002 | Paden et al. | | |
| 2003/0117237 A1 | 6/2003 | Niu et al. | | |
| 2005/0046518 A1 | 3/2005 | Zurcher et al. | | |
| 2005/0073078 A1 | 4/2005 | Lutz et al. | | |
| 2005/0151442 A1 | 7/2005 | Kihara et al. | | |
| 2008/0143217 A1 | 6/2008 | Ho et al. | | |
| 2008/0150390 A1 | 6/2008 | Hagelin et al. | | |
| 2010/0327693 A1 * | 12/2010 | Hanson | ........................ | 310/300 |

FOREIGN PATENT DOCUMENTS

WO    2010/116332 A1    10/2010

OTHER PUBLICATIONS

Hsu, W. "Vibrating RF MEMS for Timing and Frequency References", IEEE MTT-S Int'l. Microwave Symp. Digest, pp. 672-675 (Jun. 2006).

Melamud, R. et al. "Temperature-Compensated High-Stability Silicon Resonators", Applied Physics Letters, vol. 90, No. 24, 4 pgs. (Jun. 2007).

Hsu, W. et al. "Frequency Trimming for MEMS Resonator Oscillators", IEEE Int'l. Frequency Control Symposium, pp. 1088-1091 (2007).

Van Beek, J. et al. "Scalable 1.1 GHz Fundamental Mode Piezo-Resistive Silicon MEMS Resonator", IEEE Int'l. Electron Devices Meeting 2007, pp. 411-414 (2007).

(Continued)

*Primary Examiner* — Levi Gannon

(57) ABSTRACT

A micro-electromechanical resonator suspended from an anchor. The resonator has: a length; a first width at a first distance from the anchor; and a second width at a second, greater distance from the anchor. The second width is greater than the first width, and the width of the resonator tapers gradually along at least part of its length from the second width to the first width.

15 Claims, 5 Drawing Sheets

OTHER PUBLICATIONS

Melamud, R. et al. "Composite Flexural-Mode Resonator with Controllable Turnover Temperature", IEEE 20th Int'l. Conf. on MEMS, pp. 199-202 (Jan. 2007).

van der Avoort, C. et al. "The Effects of Thermal Oxidation of a MEMS Resonator on Temperature Drift and Absolute Frequency", IEEE 22nd Int'l. Conf. on MEMS, pp. 654-656 (2009).

Extended European Search Report for European Patent Appln. No. 10166527.1 (Nov. 8, 2010).

L. Meirovitch, "Fundamentals of Vibrations", pp. 408-411, McGraw-Hill, 2001.

\* cited by examiner

| $t_{SOL}$ µm | $w_1$ µm | $w_2$ µm | $\phi$ | $\tau_{TC0}$ nm | $\partial f/\partial\tau$ ppm/µm | $CD^a$ ppm | $OX^b$ ppm | Total ppm | $2 \cdot L_{opt}$ µm |
|---|---|---|---|---|---|---|---|---|---|
| 25 | 2 | 10 | 5 | 828 | -37.34 | 11 | -1545 | 1556 | 15.92 |
| 25 | 4 | 20 | 5 | 1472 | -22.98 | -2 | -1691 | 1693 | 31.85 |
| 25 | 1 | 5 | 5 | 441 | -66.69 | -2 | -1472 | 1474 | 7.96 |
| 25 | 1 | 10 | 10 | 575 | -27.33 | -526 | -785 | 1311 | 8 |
| 25 | 1 | 15 | 15 | 676 | -14.52 | -670 | -491 | 1160 | 8.51 |
| 25 | 1 | 20 | 20 | 763 | -8.65 | -698 | -330 | 1028 | 9.12 |
| 25 | 1 | 25 | 25 | 841 | -5.53 | -683 | -232 | 915 | 9.76 |
| 25 | 1 | 30 | 30 | 913 | -3.73 | -650 | -170 | 821 | 10.43 |
| 25 | 1 | 30 | 30 | 913 | -3.73 | -36 | -170 | 206 | 11.81 |
| 25 | 1 | 25 | 25 | 841 | -5.53 | 140 | -232 | 372 | 11.43 |
| 25 | 1 | 20 | 20 | 763 | -8.65 | -70 | -330 | 400 | 10.17 |
| 25 | 1 | 15 | 15 | 676 | -14.52 | 61 | -491 | 551 | 9.58 |
| 25 | 1 | 40 | 40 | 1046 | -2.01 | -39 | -105 | 144 | 13.32 |

TABLE 1    FIG 7b

MICRO-ELECTROMECHANICAL RESONATOR GEOMETRY

This application claims the priority under 35 U.S.C. §119 of European patent application no. 10166527.1, filed on Jun. 18, 2010, the contents of which are incorporated by reference herein.

FIELD OF THE INVENTION

This invention relates to optimisation of the geometry of Micro-Electromechanical Systems (MEMS) devices. In particular, it relates to the optimisation of the shape of a Bulk Acoustic Wave (BAW) resonator to provide a device with more stable characteristics, such as resonance frequency.

BACKGROUND OF THE INVENTION

MEMS resonator structures offer an attractive alternative to quartz resonators as frequency references for many applications because of their lower cost and reduced form factor.

Temperature and process variations can impact the oscillation frequency of MEMS resonators beyond the tolerance limits of many applications. MEMS resonators are for example used in reference oscillators in RF receiver circuits. The resonance frequency of a MEMS resonator in silicon exhibits a temperature drift of typically −30 ppm/K. For some applications this drift needs to be reduced significantly. For example, when using a MEMS resonator in a GSM reference oscillator the magnitude of drift needs to be below 20 ppm or even 10 ppm over a temperature range of 100K.

The main cause of the temperature dependence of the resonance frequency is the negative temperature coefficient of the elastic modulus exhibited by most of the materials of interest, such as silicon. This results in a reduction in the spring constant at higher temperatures and, consequently, a reduced resonance frequency.

Several solutions have been proposed to correct for the temperature dependence:

Active temperature compensation techniques involve keeping the resonator at a constant temperature by placing the resonator in a temperature controlled feedback loop. In this case, the temperature is measured on, or in close vicinity of the resonator. This temperature is then stabilized by heating the resonator to a preset temperature. This approach is limited by the accuracy of the temperature measurement used to determine the required correction factor.

Passive temperature compensation techniques involve designing the resonator to reduce the dependency of the frequency on temperature. One approach is to combine monocrystalline silicon with amorphous silicon dioxide ($SiO_2$), since the Young's modulus of $SiO_2$ exhibits an opposite temperature dependency to that of silicon. More generally, this approach involves deposition or growth of layers having a positive temperature coefficient of the elastic modulus to reduce the resulting error. The idea is that the positive coefficient of one material is balanced by the negative coefficient of the other, so that the combined effect is a near-zero temperature coefficient. However, these approaches are sensitive to small variations in the thickness of the deposited layer.

There is therefore a need for improved resonators that exhibit reduced sensitivity to process variations, while preferably simultaneously having a small temperature coefficient (that is, low sensitivity to temperature variations).

US 2008/0143217 discloses a tapered I-shaped bulk acoustic resonator. The resonator has a central rod coupled to two tapered lateral flanges. Process compensation is achieved using the tapered flexural members.

SUMMARY OF THE INVENTION

According to a first aspect of the invention, there is provided a micro-electromechanical resonator suspended from an anchor, the resonator having: a length; a first width) at a first distance from the anchor; and a second width at a second, greater distance from the anchor, wherein the second width is greater than the first width, and the width of the resonator tapers gradually along at least part of its length from the second width to the first width.

The tapering width of this resonator enables better control over the strain in different parts of the resonator. In particular, strain will tend to be amplified and localised on the narrower parts of the resonator, toward the anchor. This can improve the piezo-resistive gain of the resonator. At the same time, by providing a tapered layout (in plan view) rather than a step change in the width of the resonator, unwanted two-dimensional deformation, in which the resonator also flexes in the direction of the step, can be minimised. If the resonator can be made to deform in a one-dimensional mode along its length, then it can be modelled using simpler assumptions and therefore becomes easier to design to a given specification.

The resonator may be tapered along its entire length between the first and second widths. Alternatively, there may be some parts of the length of the resonator that are not tapered.

Here, the suspension position or anchor refers to the part of the resonator that is fixed to the remainder of the device. Unlike the free parts of the resonator, the position of suspension experiences minimal displacement. It will correspond to a node in the resonant mode-shape of the resonator.

The width of the resonator preferably tapers linearly from the second width (W2) to the first width (W1).

Here, linear tapering means that the tapered edges of the resonator are straight lines. This facilitates simple modelling and design.

The taper from the second width to the first width preferably forms an angle with the length direction of between 15 degrees and 75 degrees.

The first width may be the minimum width of the resonator and the second width may be the maximum width of the resonator.

The second width preferably occurs at a free end of the resonator.

Preferably, the resonator is symmetric about its longitudinal axis.

This facilitates a simple, predictable mode of oscillation, and hence more straightforward design and modelling.

The resonator may have the first width at the anchor.

By suspending the resonator at a position corresponding to the narrower first width, the strain is focused at the position of suspension. This part of the resonator acts like a spring whose properties are important in determining the resonance characteristics of the whole device.

Optionally, the resonator is symmetric about the anchor.

This can lead to a simpler, symmetrical mode of vibration, which is easier to model. Consequently, the design of the resonator may be simplified.

The shape of the resonator may consist of two isosceles trapezoids adjoining at their narrow ends, thereby forming a bow-tie shape.

Dog-bone shaped resonators are known, which consist of a narrow neck and two wider head parts at either end of the neck. The dog-bone is suspended at the middle of the neck and the transition between the head and neck is an abrupt step. The bow-tie shape has an advantage over the dog-bone resonator in controlling the strain near the suspension, which was the spring-part for the dog-bone. With the bow-tie shape, strain can be increased at the (narrow width) suspension, while theoretically maintaining the same resonance frequency, and without inducing two-dimensional deformation in the rest of the resonator.

The dimensions of the resonator may be chosen so as to satisfy the equation:

$$\frac{L_{opt}}{w_1} = \frac{-0.1327(\phi - 0.3246)(\phi + 46.435)}{2(1-\phi)},$$

where $\phi = w_2/w_1$.

This relationship between the different dimensions results in a geometry that is optimal, in at least one sense, for minimising variation in resonance frequency that is due to variations in the critical dimension of the resonator (for example, due to process variations). It is based on the assumption that as the length L of one half of the resonator changes by an amount $\epsilon$, the first width W1 changes by $2\epsilon$. This may be satisfied to a limited extent in practice.

Alternatively, the dimensions of the resonator may be chosen to satisfy the equation $$\frac{(1-\phi)\sqrt{4L_{opt}^2 + (w_1 - w_1\phi)^2} - 1}{w_1} = -0.1327\phi^2 - 5.1189\phi + 1,$$

where again $\phi = w_2/w_1$.

This relationship between the different dimensions results in a geometry that is optimal, in at least one sense, for minimising variation in resonance frequency that is due to variations in the critical dimension of the resonator (for example, due to process variations). It is based on the assumption that as the length L of one half of the resonator changes by an amount $\epsilon$, the first width W1 changes by more than $2\epsilon$. In particular, it takes into account that the variation in W1 may depend on the angle of taper of the resonator's width. This assumption may be satisfied more accurately in practice than the simpler assumption, above.

The ratio of the second width to the first width is preferably greater than 20, more preferably greater than 40.

It has been found that a larger ratio of the widths can lead to reduced sensitivity to process variations.

The resonator may comprise a first layer of a semiconductor and a second layer of a semiconductor oxide.

The presence of the semiconductor oxide helps to compensate for the thermal coefficient of the semiconductor, so that the layered resonator suffers less variation in resonance frequency with temperature. This, combined with the plan-view geometry of the resonator described above, leads to a device with excellent overall stability. The tapered shape has been found to reduce the sensitivity of the resonant frequency to variations in oxide thickness (due to process variations). In other words, the resonator device can be made relatively robust or invariant both to process variations and to temperature variations. Previously proposed strategies for reducing the unwanted effects of variations in oxide thickness complicate the thermal oxidation step. The present design avoids the need for such strategies.

The thickness of the semiconductor oxide is preferably between 0.1 and 1.5 micrometers (microns).

The optimal thickness follows from the length and widths of the resonator and can be found in an iterative manner, using a numerical procedure based on the equations presented in the detailed description below.

The dimensions of the resonator may preferably satisfy the equation $$\frac{L_{opt}}{w_1} = \frac{R - 0.1327(\phi - 0.3246)(\phi + 46.435)}{2(1-\phi)},$$

where $\phi = w_2/w_1$ and R is a free parameter between $-1000$ and 0, and wherein the thickness of the semiconductor oxide simultaneously satisfies the requirement that the resonant frequency of the resonator remains a constant, independent of changes in temperature.

Selecting the dimensions in accordance with this equation and condition results in a resonator which has an oxide thickness that is optimal for minimising temperature-related variations, and which simultaneously minimises the sensitivity to process variations in both oxide thickness and critical dimension. This can be achieved, for example, by following a design methodology described in detail herein.

The variation in geometry before oxidation (CD) is typically $-25$ nm to $+25$ nm around nominal dimensions. For geometries of typically 50 microns the variation is hence 0.1%. For the oxidation process (OX) that comes afterwards, the growth rate differs from one specimen to the next. Independent of targeted thickness, the variation will be 5%. Usually, CD can be considered as an absolute error, and OX as a relative error.

Consequently, in the context of the present invention, an equation governing the geometry of a resonator should be deemed to be satisfied at least if each of the lateral dimensions is within $+/-25$ nm or $+/-0.1\%$ of the nominal dimensions which would exactly satisfy the equation. A requirement on the optimal thickness of an oxide should be deemed to be satisfied at least if the oxide thickness is within $+/-5\%$ of the thickness which would exactly satisfy the requirement.

BRIEF DESCRIPTION OF THE DRAWINGS

The invention will now be described by way of example with reference to the accompanying drawings, in which:

FIG. 7b shows Table 1, which tabulates the data presented in FIG. 7; and

DETAILED DESCRIPTION OF EMBODIMENTS

It is desired to design a resonator that is relatively stable with respect to variations in the manufacturing process and variations in operating temperature. This will result in a resonator that can be Produced economically, by well understood processes yet is reliable in use, because it is largely immune to temperature changes. The present inventor has considered three sources of error (or "spread") in the resonant frequency of a MEMS resonator:

Frequency variation due to changing operating temperature, as a result of the thermal coefficient of the semiconductor material;

Frequency variation due to errors in the oxide thickness, when oxidation is used to compensate for the thermal coefficient of the semiconductor; and Frequency variation due to errors in the critical dimension (CD) of the device during fabrication—called "dimension spread".

In the following, a geometry for a bulk-mode (BAW) MEMS resonator according to an embodiment of the invention is presented that shows low spread in resonance frequency after production on Silicon-On-Insulator (SOI) wafers. Moreover, the change of frequency versus temperature, as observed for silicon resonators, is reduced to a large extent. The beneficial properties are realized by the geometry in particular; and closed-form expressions have been derived in order to design the top-view (plan) geometry and the optimal SOI layer thickness.

The present inventor has derived an analytical model to predict the variability of frequency as well as the temperature coefficient based on a given nominal design. The essentially one-dimensional single-sided model treatment suggests a body that is narrow at the suspension end and much wider at the other, free end. Next, the SOI thickness is chosen to match the geometry, in order to properly compensate for the temperature coefficient of the semiconductor. This can be done in an iterative manner, starting with a common thickness. For example, for a typical SOI wafer process, a starting thickness of 1.5 microns may be chosen. As a result, a device geometry is determined that can be realised as easily as any other design, made in an SOI layer of desired thickness. This body can then be treated with an uncomplicated, uniform thermal oxidation process, to achieve the correct oxide thickness. Process-variations in the critical dimension and oxide thickness will have only a minor effect on the device characteristics, in particular its resonant frequency.

Studies on thermal oxidation of resonators of the dog-bone type indicate that the effect of oxidation is required on the spring-part (the neck of the dog-bone). However, it is difficult and complicated to selectively oxidise this part. Without selectivity, for example by shielding, the oxidation will be just as strong on the head of the resonator, which results in high sensitivity to process variations of the oxide thickness (that is, poor frequency-spread performance).

Figure 1:
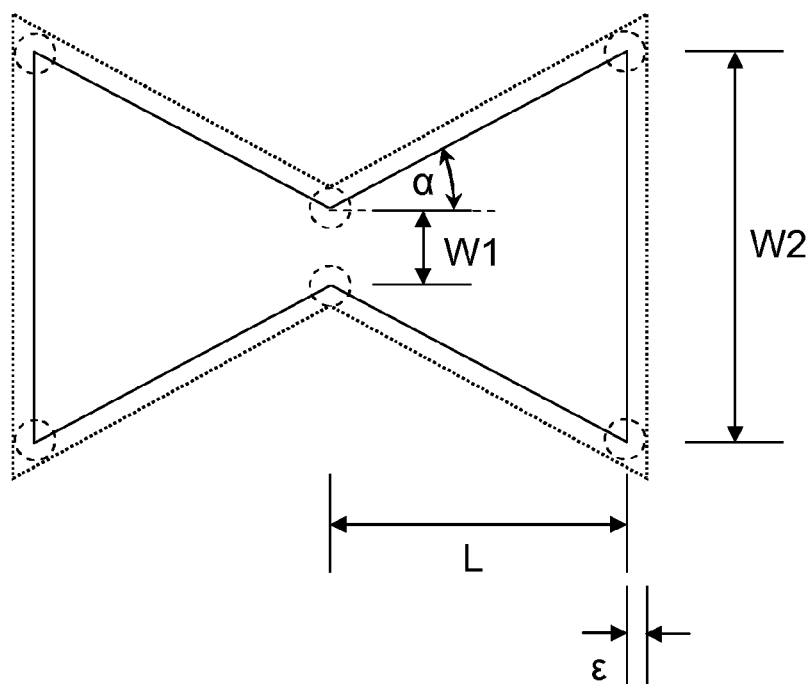
FIG. 1 shows a bow-tie shaped resonator in accordance with an embodiment of the invention.

According to an embodiment of the invention, a different geometry is now presented, as shown in FIG. 1. This bow-tie shape has an advantage over the dog-bone resonator in controlling the strain near the suspension, which was the spring-part for the dog-bone. Scaling down the spring of a dog-bone resonator does increase strain, while frequency can theoretically be kept equal; but this will induce two-dimensional deformation of the head. The clear mass-spring distinction is then lost. Optimization for simultaneous CD-control and oxidation-induced frequency spread is difficult and can even lose convergence for a very narrow spring (neck). However, for the bow-tie mode of resonance a one-dimensional assumption is more valid. Moreover, the strain amplification can be controlled in the design by adjusting the tapering ratio.

The geometry of FIG. 1 shows a symmetric resonator that is characterised by the length L of each symmetric side, a first width W1 at its centre and a second width W2 at its outer ends. The shape tapers inwards linearly from the second width W2 to the first width W1. This resonator is designed to be suspended from an anchor at its centre. In other words, the first width W1 is at the anchor position and the second width W2 is at the free end. In this example, the first width W1 is the minimum width of the device and occurs only at the centre. Likewise, the second width W2 is the maximum width of the device and occurs only at the end. The narrowest width W1 thus represents an axis of symmetry and the resonator will be attached to its anchor along this axis. The resonator is also symmetric about a longitudinal axis, in the length direction. Each symmetric half of the resonator is an isosceles trapezoid—a quadrilateral with a line of symmetry bisecting one pair of opposite sides, which are parallel but unequal in length (these sides correspond to the two widths W1, W2).

The linear taper between the two widths W2 to W1, over the length L, gives rise to a taper-angle, α, with respect to the length direction. Also shown in FIG. 1 is a dotted outline illustrating the effect of critical dimension (CD) spread in the semiconductor fabrication process. The dotted line shows the effect on the geometry of the resonator when the length L is increased by an error c.

Figure 2:
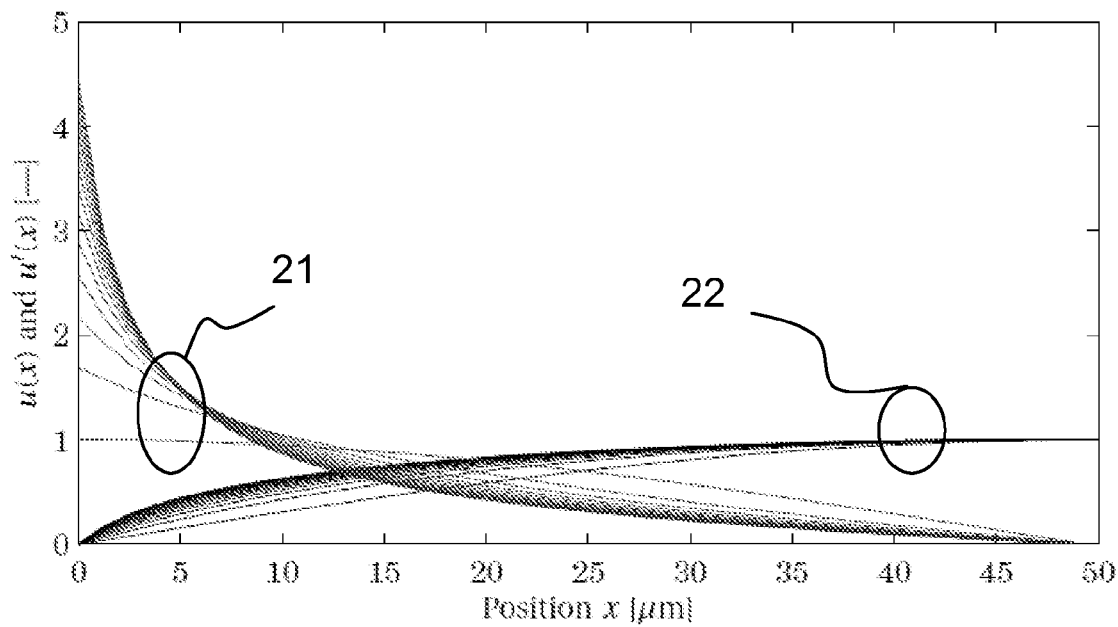
FIG. 2 illustrates the variation in resonant mode-shapes and strain profiles according to a varying ratio of widths, for a bow-tie resonator of the type shown in FIG. 1.

FIG. 2 shows the effect of the geometry on the mode-shape u(x), labelled 22, for 0<x<L with L=50 μm. The resulting strain, ε(x)=u'(x), labelled 21, is altered as well. If the width at the suspension (anchor) is $w_1$ and at the free end labelled $w_2$, then the tapering ratio $\phi=w_2/w_1$ expresses the change in geometry and clearly controls the mode-shape. The mode-shape u(x) for a straight rod with one free end is a quarter of a sine, normalized to 1 in this case. FIG. 2 shows the effect on both u(x) and u'(x) when the width at the free end is increased up to 40 times wider than the width at the suspension.

Figure 3:
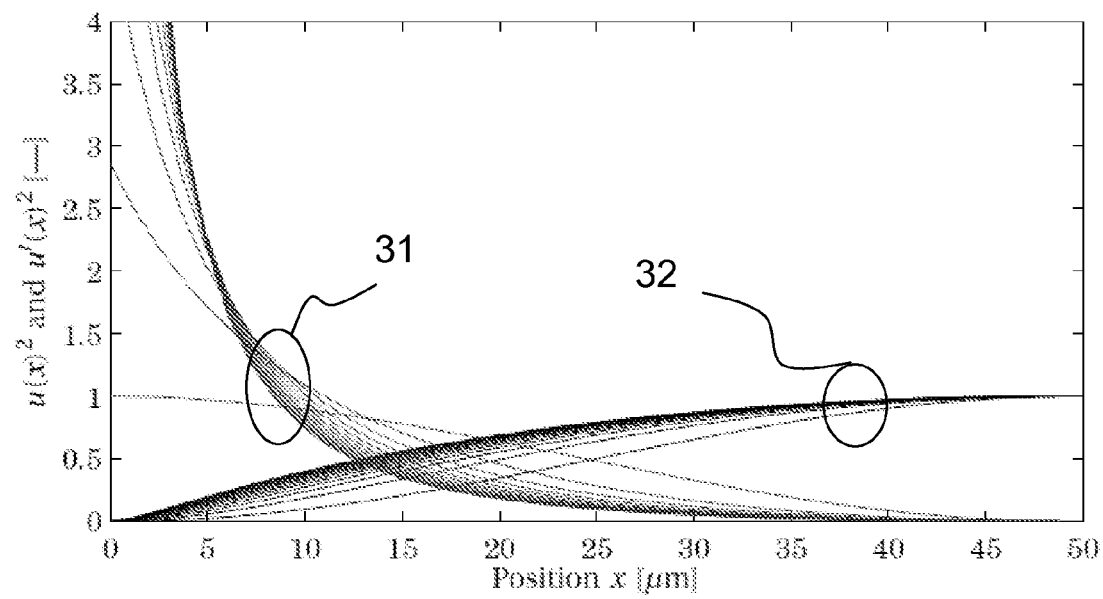
FIG. 3 shows the effective mass and spring constant as a function of distance from the suspension point, for the same set of varying width-ratios.

FIG. 3 depicts the effect ratio φ has on the effective mass- and spring-constants. The effective mass 32 and effective spring constant 31 of a bulkmode resonator are based on $u(x)^2$ and $u'(x)^2$, respectively. As kinetic and potential energies scale with $u(x)^2$ and $u'(x)^2$, respectively, it can be seen that the relative presence of the region near the suspension—the so-called spring-part for a dog-bone—in the strain-squared functions is largely amplified, up to a factor of 20. The beneficial effect of the oxide on the spring-part can be increased and hence there is a relative reduction in the effect of oxidation on the mass-part, where the added oxide mass would cause spread on frequency.

The bow-tie structure of FIG. 1 has an advantage over the dog-bone design. As the cross-sectional area is linearly growing, a one-dimensional modelling approach tends to be more reliable. The extensional vibration will still be governed by the differential equation:

$$E\frac{d}{dx}\left[A(x)\frac{du(x)}{dx}\right] = -\omega^2 \rho A(x) u(x),$$

in which mode-shape is u(x); cross-sectional area is A(x); and angular eigen-frequency is ω. As before, only one half of the resonator is modelled. Three dimensions $w_1$, being width at anchoring, $w_2$, being the width at the free end and L, being the single-sided length, respectively, characterise the shape.

Although the area is simply:

$$A(x) = w_1\left(\frac{L-x}{L}\right) + w_2\left(\frac{x}{L}\right),$$

for $0 < x < L$, it is not trivial to find a general solution to the differential equation.

Numerical calculations of eigenmodes of the one-dimensional differential equation can easily be derived by those skilled in the art. The results are compared to the known solution for a rod of constant cross-sectional area. For this simple shape, the resonant frequency is given by:

$$f = \frac{1}{4L}\sqrt{\frac{E}{\rho}},$$

so that length is the only geometrical factor that matters. Material constants E, for Young's modulus, and $\rho$, for mass density, are assumed to be constant and known. For the bowtie shape, the numerical results for the fundamental resonance frequency can be described by $$f = \frac{1}{4L}\sqrt{\frac{E}{\rho}} g(\phi),$$

in which $$g(\phi) = g\left(\frac{w_2}{w_1}\right),$$

and g is an unknown function. It is found that the ratio $w_2/w_1$ determines the frequency, rather than the absolute value of either $w_1$ or $w_2$.

Figure 4:
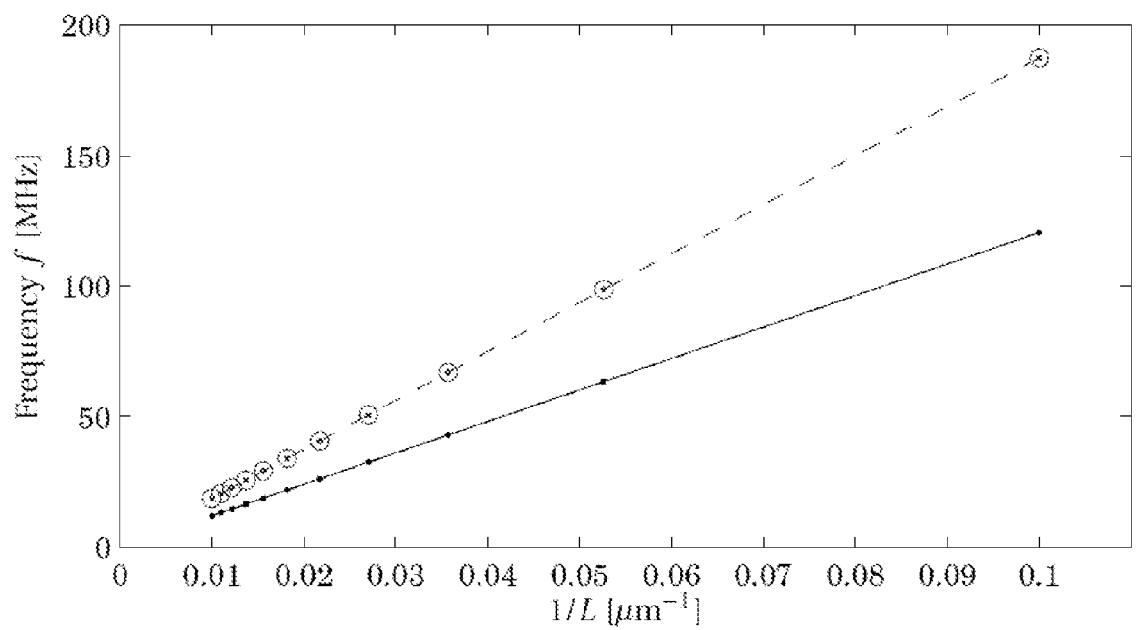
FIG. 4 is a graph of resonance frequency as a function of the length, L, of a resonator.
Figure 5:
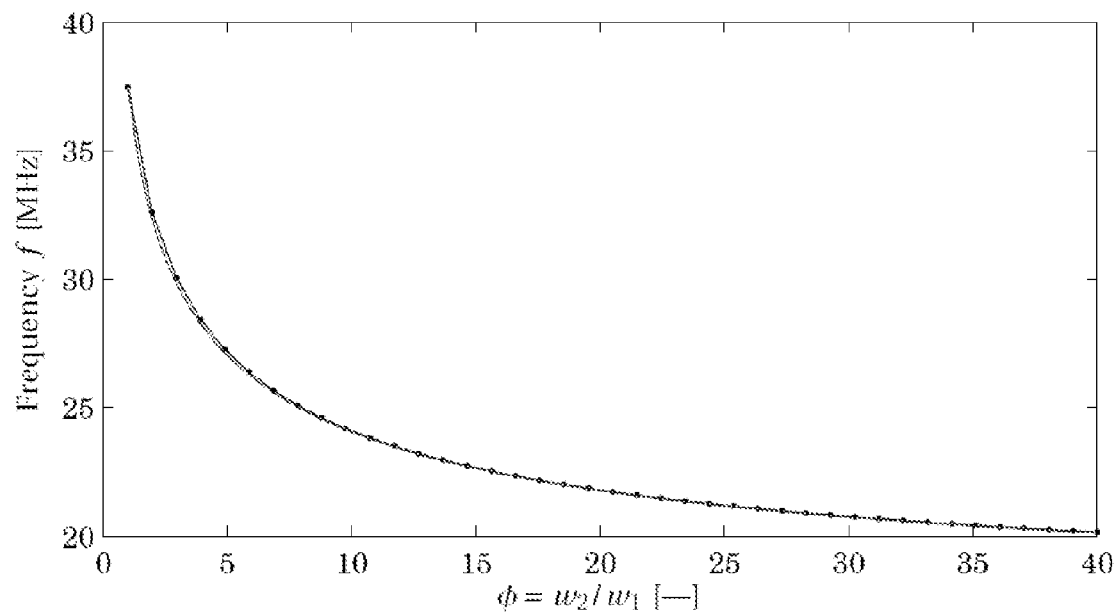
FIG. 5 is a graph of resonance frequency as a function of the width ratio.

FIGS. 4 and 5 illustrate the geometrical dependency of the resonance frequency, as found by numerical simulation. FIG. 4 shows the resonance frequency, f, as a function of length L. The solid line is for a bow-tie with $w_2=10w_1$; and the dashed line is for the rod (beam), where $w_2=w_1$. Dots are numerical simulations, while circles are directly calculated. FIG. 5 shows resonance frequency as a function of the ratio $\phi$. Three different dimensions for $w_1$ were tested numerically, all resulting in identical curves.

The bowtie geometry allows one-dimensional modelling, but is actually chosen to produce maximal strain in the resonator near the anchors. As the ratio $w_2/w_1$ grows, the maximum strain increases, compared to the straight rod where the strain profile is cosine-like from maximum at anchor to zero at the free end. The strain scaling with $w_2/w_1$ will be useful for uniform oxidation, as will be described further below.

Before modelling the oxidized resonator, the effect of geometric variation (CD spread) in silicon without oxidation will now be described.

It is assumed that geometric variations are uniform. FIG. 1 shows the growth of a designed geometry by a certain increase $\epsilon$. Consequently, the geometry changes. The increase in length is easily denoted as $$L^* = L_0 + \epsilon,$$

but for the widths a careful analysis is required. FIG. 1 illustrates that the angle $\alpha$ remains unchanged and that $w_1$ will grow by more than just $2\epsilon$. The angle is found from:

$$\tan\alpha = \frac{w_2/2 - w_1/2}{L},$$

so that the width scales as:

$$w_1^* = w_1 + 2\cdot\delta,$$

with $$\delta = \frac{\varepsilon}{\cos\alpha}.$$

The new width at the free end is then found to be:

$$w^*_2 = w^*_1 + 2(L_0 + \epsilon)\tan\alpha.$$

As mentioned before, the resonance frequency is determined by length and a ratio of widths. Having found the dimensions as a function of error $\epsilon$, the robustness of frequency with respect to $\epsilon$ can be investigated.

The frequency of a bowtie resonator can be written as $$f = \sqrt{\frac{E}{\rho}} \cdot h(L(\varepsilon))\cdot g(\phi(\varepsilon)), \quad (1)$$

where $$h = \frac{1}{4L(\varepsilon)}$$

so that a function h for length and a function g for ratio of widths are incorporated. Frequency robustness implies that $$\frac{\partial f}{\partial \varepsilon} = 0$$

near $\epsilon=0$. Using the chain rule of differentiation and the product rule, the partial derivative is:

$$\frac{\partial f}{\partial \varepsilon} = \sqrt{\frac{E}{\rho}}\left[h(L)g'(\phi)\frac{\partial \phi}{\partial \varepsilon} + h'(L)\frac{\partial L}{\partial \varepsilon}g(\phi)\right] = 0.$$

Without knowing function $g(\phi)$ this can be written:

$$L_0\frac{\partial \phi}{\partial \varepsilon} = \frac{g(\phi)}{g'(\phi)}, \quad (2)$$

where the left-hand side can be evaluated using the expressions for $w_2^*$ and $w_1^*$ presented above. Numerical simulation reveals that the following polynomial is a good fit for the right-hand side:

$$\frac{g(\phi)}{g'(\phi)} = p(\phi) = -0.1327\phi^2 - 5.1189\phi + 1,$$

which is an intrinsic property of the resonator and does not depend on the absolute widths, but only on their ratio. Given this second-order polynomial p(φ) the unknown function g(φ) can be found, because $$\begin{cases} g(\phi) = p(\phi)g'(\phi) \\ \quad g(1) = 1. \end{cases} \quad (5)$$

The function can now be found from:

$$g(x) = \exp\left(\int_1^x \frac{1}{p(y)} dy\right),$$

although the final solution is not needed for optimisation, because the polynomial can be used to design an optimal resonator. In order to calculate frequencies according to equation (1) one might use the expression $$g(\phi) = \frac{0.4704(38.769 + \phi)^{0.1934}}{(\phi - 0.1944)^{0.1934}}.$$

For optimisation, an expression is needed for the left-hand side of equation (2) above. Using the expressions derived for $w_2^*$ and $w_1^*$, the left-hand side expands to:

$$L_0 \frac{\partial \phi}{\partial \varepsilon}\bigg|_{\varepsilon=0} = \frac{-w_1 + \sqrt{4L_0^2 + (w_1 - w_2)^2}(w_1 - w_2)}{w_1^2}, \quad (3)$$

Note that this is derived using precise (correct) assumptions about the relationship between L, $w_1$, and $w_2$ under critical-dimension scaling. However, if this precise assumption is relaxed, a different expansion emerges. In particular, consider what happens if the width grows according to 2ε, instead of 2δ:

$$w_1^{**} = w_1 + 2 \cdot \varepsilon,$$

and $$w_2^{} = w_1^{} + \left(\frac{w_2 - w_1}{L_0}\right)(L_0 + \varepsilon).$$

The left-hand side of equation (2) then becomes:

$$L_0 \frac{\partial \phi}{\partial \varepsilon}\bigg|_{\varepsilon=0} = \frac{(2L_0 - w_1)(w_1 - w_2)}{w_1^2}. \quad (4)$$

The present inventor has discovered that growth of the geometry according to this fraction shows beneficial properties for reducing overall spread, incorporating both silicon CD spread as well as oxidation-induced spread. This is counter-intuitive, since the simplified assumption on which it is based is theoretically less accurate.

Expressions will now be presented for the optimal desired length $L_0$, for which frequency spread due to CD variations is minimised.

For the relaxed ("wrong") scaling assumption, the expression of equation (4) is substituted into the left-hand side of equation (2). Together with the polynomial expansion for the right-hand side of equation (2), this provides a simple equation that can be solved for $L_0$, leading to an optimal length for being CD invariant as a function of ratio φ:

$$\frac{L_{opt}}{w_1} = \frac{-0.1327(\phi - 0.3246)(\phi + 46.435)}{2(1 - \phi)}. \quad (5)$$

Figure 6:
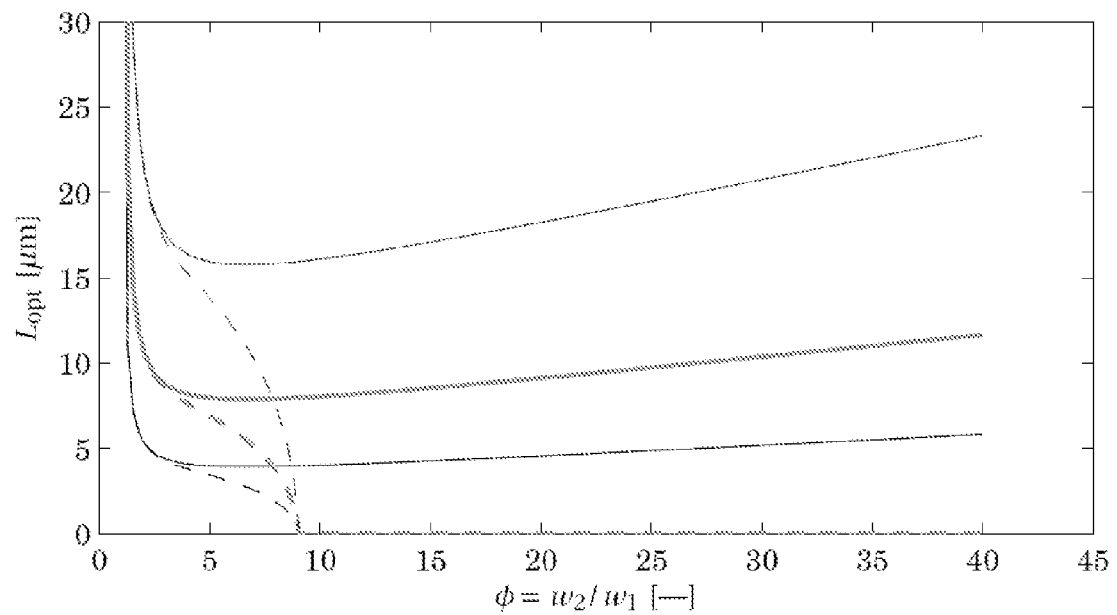
FIG. 6 illustrates the calculation of an optimal length for the resonator, so that the effect of unintended process variations on the device characteristics is minimised.

FIG. 6 shows curves for $L_{opt}(\phi)$ for various widths $w_1$. The solid curves are for the relaxed scaling assumption. At this point, it is noted that the absolute widths are relevant (not just the ratio) for finding the optimal length, although only the ratio of widths determines the frequency. From top to bottom, the curves correspond to first widths $w_1$ of 4, 2, and 1.

An equation for the optimal length can be found similarly for the precise (correct) scaling assumption. Instead of equation (4), the expression of equation (3) is substituted into the left-hand side of equation (2). When this, more complex, expression is now not solved for $L_0$, but instead posed implicitly, it is found that $$\frac{(1 - \phi)\sqrt{4L_{opt}^2 + (w_1 - w_1\phi)^2} - 1}{w_1} = -0.1327 \phi^2 - 5.1189 \phi + 1. \quad (6)$$

Curves for $L_{opt}$ derived according to this relationship are shown by the dashed lines in FIG. 6. The curves show that, for small width-ratios, the values of L under both assumptions correspond closely. However, as the ratio increases, they diverge quickly and at beyond a ratio of about 8, it is no longer possible to solve for an optimal length according to the precise scaling assumption.

As stated before, the bowtie geometry has beneficial properties for reducing the expected frequency change after oxidizing. Oxidation has not been considered in the above analysis. In the following discussion, it will become clear that fairly large tapering (that is, large values of φ) will be required. For example, a ratio φ greater than 20 is beneficial, and more preferably greater than 40. As noted above, such high ratios are not supported under the precise scaling assumption.

The following calculations analyse combined CD control and oxidation-thickness invariance based on the relaxed scaling assumptions and the associated "wrong" $L_{opt}$. The reason is that this scaling law apparently has large benefits, in the sense that large values for φ(specifically φ>8) are accessible, and should be achievable by altering the geometry. For example, the geometry might incorporate holes, or special shape-features at the rim (as will be discussed in greater detail below). Note that all calculations here assume a solid resonator structure. However, those skilled in the art will be able to adapt them to account for holes in the resonator structure, which can be useful to realise the scaling law.

A large number of numerical simulations is performed. The bow-tie resonator can be simulated using a discrete one-dimensional model, in which a bar is segmented into a number of elements that allow one-dimensional deformation. The effective material properties for each element represent the varying cross-sectional area function A(x). Moreover, the oxidation is accounted for so that two materials are present. Effective material properties are defined as:

$(EA)_{eff} = (wh)E_{si} + (2\tau w + 2\tau h + 4\tau^2)E_{ox}$ $(\rho A)_{eff} = (wh)\rho_{si} + (2\tau w + 2\tau h + 4\tau^2)\rho_{ox},$ where $w = w(x) = w_0(x) - 2v\tau$ and $h = t_{SOI} - 2v\tau.$ Here, the variable h refers to the thickness dimension, out of the plane of the resonator. As above, w refers to the width of the resonator, which is a function of the position, x, along the length. Variable τ is the oxide layer thickness, and constant ν is the fraction of silicon consumption for an oxide layer. When oxidising Silicon, a layer of SiO₂ is formed on the surface. 44% of this thickness (ν=0.44 means 44%) lies below the original Silicon surface level. Note that the thermal oxidation is assumed to be uniform over each individual resonator—what is being considered here is not variations in oxide thickness across the surface of a single resonator, but the variation between oxide thicknesses for different resonators. This occurs due to differences in oxidation rate over a wafer.

Mode-shapes and resonance frequencies are calculated for each of a range of oxide thicknesses, for each starting geometry. Then the same run is performed again, now with 50 nm growth (ε=50 nm) on the geometry. This enables the frequency to be determined as a function of oxide layer thickness and the expected spread due to CD.

Figure 7:
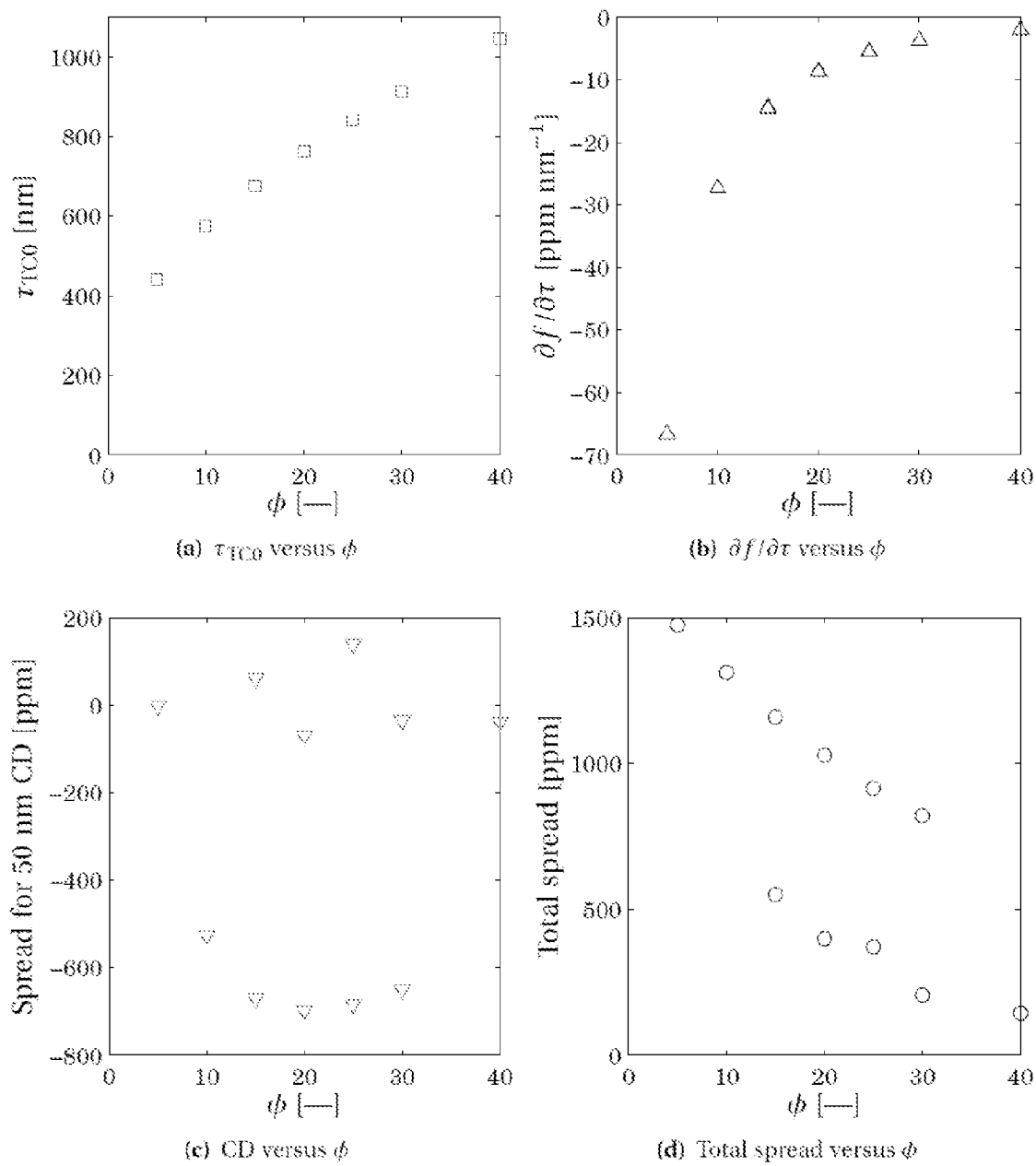
FIG. 7 illustrates the dependence of various parameters on the ratio of widths.

Table 1 and FIG. 7 show the outcome of these simulations. Table 1 considers two sources of frequency spread of oxidized resonators. Deviations in silicon geometry before oxidation (CD) will result in a range of frequencies after oxidation and limited accuracy in achieving the targeted oxide thickness. Meanwhile a certain frequency versus oxide-thickness curve contributes a further perturbation in resonance frequencies (OX). The column labelled CD indicates the spread due to variation in silicon, evaluated at oxide thickness $\tau_{TC0}$. The column labelled OX indicates the frequency spread due to a 5% deviation from the targeted oxide thickness, based on $\partial\eta/\partial\tau$ and the targeted $\tau_{TC0}$.

FIG. 7 is a graphical representation of the data in Table 1. Only geometries with $w_1=1$ are included in the table, as there was no targeted absolute frequency. The required oxide thickness is found using the formulae for temperature-dependent elastic material constants:

$$E_{Si}(T) = 131 \text{ GPa} \cdot (1 - 60 \cdot 10^{-6} T)$$

$$E_{SiO_2}(T) = 73 \text{ GPa} \cdot (1 + 196 \cdot 10^{-6} T)'$$

in which the specified numbers are general material properties. Because of the bulk-acoustic operation of the resonator, the effective stiffness of any cross-sectional area A in the resonator is $$EA_{eff}(T) = whE_{Si}(T) + (2\tau w + 2\tau h + 4\tau^2)E_{SiO_2}(T),$$

where the width w follows from the geometry and h is the thickness of the silicon in the SOI starting material. The oxide thickness, τ, is varied until the effective stiffness is a constant value, independent of temperature, T.

FIG. 7(a) shows that the required oxide thickness remains moderate but does increase with aspect ratio φ. The favourable effect of larger φ on the reduction of frequency change while oxidising is clearly illustrated by FIG. 7(b). In FIG. 7(c) two clouds can be discerned. The data points far away from zero show that the oxidised resonator is not insensitive to size-variations, as the condition in Equation (2) provides a robust geometry without oxidation. The datapoints near zero have R≠0 in an adapted version of Equation (2) that includes a free parameter R. This parameter R enables the dimensions of the resonator to be optimised when the oxide thickness is non-zero, as will be explained in greater detail below. Combination of the two sources of error, as shown in FIG. 7(d), by taking 5% on τ times df/dτ plus the spread caused by 50 nm of CD, shows two groups of data points with clearly receding trends versus φ. For a truly spread-free design, a locally shallow function f(τ) is needed, as well as low CD spread. It is important to note that this CD spread should be low after oxidation—that is, evaluated locally, not at τ=0. Recall that the equations derived previously above assumed a pure silicon resonator. For this reason, a free parameter, R, is incorporated in the model to allow values to be found for $L_{opt}$ for which spread is nonzero before oxidation, but near zero at $\tau=\tau_{TC0}$.

The new CD control law required to generate the near-zero points in FIG. 7(c) is formulated as follows. Equation (2) is rewritten as $$L_0 \frac{\partial \phi}{\partial \varepsilon} - \frac{g(\phi)}{g'(\phi)} = R,$$

which for R=0 reduces to the original spread-free condition. Solving for $L_{opt}$ then results in:

$$\frac{L_{opt}}{w_1} = \frac{R - 0.1327(\phi - 0.3246)(\phi + 46.435)}{2(1-\phi)},$$

in which R is to be found from numerical simulations. For R=0, the geometry will be insensitive to CD when there is no oxide. Given that geometry, the growing of oxide is simulated, until the point that temperature-insensitivity is obtained. The simulations will then show that the structure is no longer robust to variations in critical dimension (CD). R is then altered and the procedure repeated until CD-robustness is obtained at the point that oxide has grown up to the desired thickness. Due to the formulation, only iterative solutions are possible. Sensible numerical values for R are between 0 and −1000. The asymptotic behaviour for φ=1 is clearly present, as well as the simple scaling with $w_1$. Note that the simplified but incorrect model is used to derive this expression.

Figure 8:
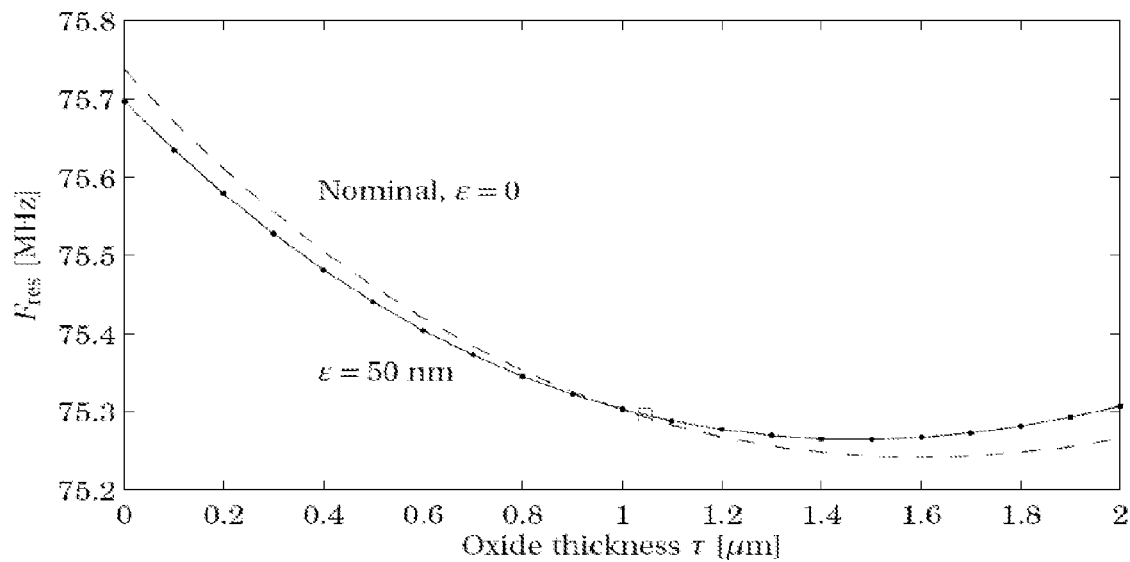
FIG. 8 plots calculated resonance frequencies as a function of oxide layer thickness and also shows the effect of a change in critical dimension on the resonance frequency.

Using R, not only different optimal lengths for the resonator are found, but also a different CD behaviour. This is shown in FIG. 8. This graph shows two series of calculated resonance frequencies $F_{res}$ as a function of oxide layer thickness τ. The solid line corresponds to the nominal geometry, for which ε=0; and the dashed line corresponds to a growth of ε=50 nm imposed on the nominal geometry. The other dimensions are as follows: $w_1=1$ μm, $\phi=w_2=40$ μm, $t_{SOI}=25$ μm, and R=−60. The equation above is used to solve for $L_{opt}$. At τ=0, we see that the resonant frequency decreases when epsilon changes from ε=0 to ε=50. So, without oxide, this design would show a frequency spread after production. The square indicates the point where the oxide thickness is such that the temperature coefficient for the nominal design is 0. The curves for frequency cross near the square, meaning that a low-variability, low temperature-coefficient design has been achieved. This is the result of iterative optimisation to find the proper value for R. The effect of oxidation on frequency is clear, as well as the effect induced by CD.

In summary, the following design methodology can be followed to arrive at a resonator geometry according to an embodiment of the invention.

Firstly, to obtain a resonator having a specified resonant frequency, which is insensitive to production variations, the following procedure can be followed:

1. Set and keep R=0 (this is only needed for oxidised resonators, in the second stage of the design process).

2. Pick any suitable, desired silicon thickness (SOI thickness), since this does not affect the determination of geometry.

3. Re-write equation 1 to determine L as a function of the desired resonant frequency, f, and width-ratio φ. The ratio can be chosen freely in the range 1<φ<40, at this stage.

4. In order to be robust against dimensioning errors due to process spread, the width w1 should now be chosen according to the determined value of L and chosen φ. Equation (5) or equation (6) can be used for this. Note that, in the case of equation (6), for the "correct" scaling assumption, the choice of φ is limited to 1<φ<8.

So far, the geometry has been found entirely from closed-form expressions and therefore iterative optimisation was unnecessary. However, this changes when oxidation is taken into account (as is necessary to ensure temperature stability of the resonant frequency). In the second stage of the design procedure, the initial, closed-form design is adjusted in consideration of the oxide layer:

1. Start with the optimal geometry derived in the first stage, above.
2. Use the desired SOI thickness to set height "h".
3. Use the expressions for $EA_{eff}$ and $\rho A_{eff}$ to calculate effective material parameters as a function of position x along the resonator, as cross-section A(x) follows the optimized geometry. The material parameters hence change with x, and are themselves functions of oxide thickness τ.
4. Numerically solve the differential equation $$E \frac{d}{dx}\left[A(x)\frac{du(x)}{dx}\right] = -\omega^2 \rho A(x) u(x),$$

using the calculated effective material constants, for each of a variety of candidate oxide thicknesses, to provide the resonance frequency as a function of oxide thickness. Those skilled in the art will be very familiar with techniques for solving such equations—for example, using Finite Element Modelling (FEM) software.

4b. Repeat the calculations of step 4 for an elevated temperature, whereby the elastic constants in the equations are different.

5. The required oxide thickness is found as the point where the graphs obtained from 4 and 4b cross one another: having that thickness, the resonance frequency will be fixed, no matter the temperature.

6. Now evaluate: if the indicated optimal oxide thickness is >>1 micron, then a larger value of φ would be beneficial. However, note that this will alter the geometry of the resonator and so steps 1-4 from the first stage of the design procedure (above) must be repeated.

As an alternative to step 6: (6'). In order to reduce the required layer thickness for the oxide, check that the original SOI thickness chosen is larger than the calculated width w1. Increase the SOI thickness; go to step 2 in this second-stage procedure; and check if the indicated optimal oxide thickness is now less. Note that the latter solution (6') is less effective than the first (6).

7. Finally: use parameter R to achieve an oxidised resonator that is simultaneously insensitive to small geometric variations in the top-view geometry, CD. To do this, a closed-form calculation is performed, to determine the optimal dimensions. This is similar to the first stage of the design method, but this time with a non-zero value for R, using the modified equation:

$$\frac{L_{opt}}{w_1} = \frac{R - 0.1327(\phi - 0.3246)(\phi + 46.435)}{2(1-\phi)}$$

The altered geometry (at least the length, L) also affects the frequency, which will also need to be re-calculated.

As in steps 4 and 4b, numerical solution of the differential equation is used to calculate two series of frequencies versus oxide thickness. This time, instead of varying the temperature, the geometry is perturbed. In one series, the nominal geometry (found in the first stage) is used, while in the second series this nominal geometry is scaled by adding 50 nm to all edges. Parameter R will control the oxide thickness at which again the frequency curves cross. This crossing will be at τ=0 for R=0. The parameter R should be varied until the curves cross for the same value of τ as obtained in step 5.

Steps 3-7 are iterated, alternately revising the geometry and the oxide thickness, until a solution is found which has the desired resonant frequency and is stable with respect to CD (geometry change); oxide thickness variation; and temperature.

As can be seen from FIG. 8, the resonant frequency is dependent on τ. Therefore, in the process of optimising for invariance to temperature and CD, the frequency of the device will have changed. To return to the originally specified resonance frequency one has to realise that the desired frequency for optimal geometry before oxidation needs to be chosen higher than the intended final frequency. In the process of iteration this is easily achieved.

As explained previously above, the tapering of the resonator means that the frequency versus oxide-thickness behaviour is flattened. The second source of frequency spread—dimension spread in silicon, referred to as CD—is effectively reduced by first solving for initially spread-free bowtie designs and later incorporating a degree of freedom to tune the minimum CD to the oxide thickness that is targeted for a near-zero temperature coefficient.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein the tapered portion is part of a more complex resonator geometry. This could involve extending the free end of the resonator with a constant width $w_2$. Likewise, at the suspension position, there may be a segment of non-zero length with a uniform width of $w_1$. In this way, the bow-tie design can be combined with the features of the dog-bone resonator, replacing the step in the width of the dog-bone with a continuous taper.

In the embodiments described above, the taper was linear (that is, the resonator was straight-edged). In other embodiments, curvilinear tapering may be used.

In the above description, it was noted that the "wrong" scaling assumption, which results in equation (6) is not precisely satisfied in practice, for the simple bow-tie design of FIG. 1. Referring to FIG. 1, the "wrong" scaling assumption implies that on the tapering edges (rather than the ends), the actual growth is slightly less than the growth, ε, indicated. The wrong scaling assumption applies a growth of c parallel to the arrow W2, instead of perpendicular to the tapered edges (as is the case in FIG. 1). This makes the growth on the tapered sides slightly less, compared with the growth in the length direction. In other words, in order to imitate the 'wrong' scaling assumption more closely in practice, the design could be modified to produce relatively more growth of material in the length direction. This can be achieved by enlarging the length of the perimeter along the ends at x=L and x=−L. Adding crenels, or other length-increasing shape features on these edges will do this. In general, small indentations or projections can be used as length-increasing features. As a rule of thumb: the error between ε and δ (giving the amount of extra material at the side edges) is a function of $\phi=w_2/w_1$. Therefore, the inverse ratio of $\delta$ and $\epsilon$ should be added to the length of the end-edges by the addition of the shape features.

Now, when dimension growth occurs due to manufacturing process variations, the relative addition of material to the tapered edges will be relatively less, compared to the ends—just as the 'wrong' scaling assumption demands. This variation to the basic design process may result in practical implementations which are able to more accurately produce the desired stability in resonant frequency. A similar effect could be achieved by adding holes to the solid resonator pictured in FIG. 1.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A micro-electromechanical resonator, the resonator comprising:
   a suspension position at which the resonator is fixed to an anchor;
   a length;
   opposing portions along respectively opposing sides of the suspension position, wherein each opposing portion respectively has
      a first width at a first distance from the anchor,
      a second width at a second, greater distance from the anchor, the second width being greater than the first width, and
   along each opposing portion, the width of the resonator tapers along at least part of its length from the second width to the first width.

2. The resonator of claim 1, wherein the width of the resonator tapers linearly from the second width to the first width.

3. The resonator of claim 2, wherein the taper from the second width to the first width forms an angle with the length direction of between 15 degrees and 75 degrees.

4. The resonator of any of claim 1, wherein the first width is a minimum width of the resonator and the second width is a maximum width of the resonator.

5. The resonator of claim 4, wherein the second width occurs at a free end of the resonator.

6. The resonator of claim 1, wherein the resonator is symmetric about its longitudinal axis.

7. The resonator of claim 1, wherein the resonator has the first width at the anchor.

8. The resonator of claim 1, wherein the resonator is symmetric about the anchor.

9. The resonator of claim 1, further comprising at least one of a plurality of holes and perimeter-lengthening shape features in at least one edge.

10. The resonator of claim 1, wherein a ratio of the second width to the first width is greater than 20, and further comprising at least one of a plurality of holes and perimeter-lengthening shape crenels in at least one edge.

11. The resonator of claim 1, further comprising a first layer of a semiconductor and a second layer of a semiconductor oxide.

12. The resonator of claim 11, wherein a thickness of the semiconductor oxide is in the range 0.1 to 1.5 micrometers.

13. A micro-electromechanical resonator suspended from an anchor, the resonator comprising:
   a length;
   a first width at a first distance from the anchor; and
   a second width at a second, greater distance from the anchor,
   wherein the second width is greater than the first width, and the width of the resonator tapers along at least part of its length from the second width to the first width, wherein the resonator is symmetric about the anchor, and a shape of the resonator includes two isosceles trapezoids adjoining at their narrow ends, thereby defining a bow-tie shape.

14. A micro-electromechanical resonator suspended from an anchor, the resonator comprising:
   a length;
   a first width at a first distance from the anchor; and
   a second width at a second, greater distance from the anchor,
   wherein the second width is greater than the first width, and the width of the resonator tapers along at least part of its length from the second width to the first width, wherein the dimensions of the resonator satisfy one of the following two equations:

$$\frac{L_{opt}}{w_1} = \frac{-0.1327(\phi - 0.3246)(\phi + 46.435)}{2(1-\phi)};$$

and $$\frac{(1-\phi)\sqrt{4L_{opt}^2 + (w_1 - w_1\phi)^2} - 1}{w_1} = -0.1327\phi^2 - 5.1189\phi + 1$$

where $\phi=\psi=W_2/w_1$, and where $\psi$ is a tapering ratio of the first width and the second width; $L_{opt}$ is an optimal thickness; $W_1$ is the first width; and $w_2$ is the second width.

15. A micro-electromechanical resonator suspended from an anchor, the resonator comprising:
   a length;
   a first width at a first distance from the anchor; and
   a second width at a second, greater distance from the anchor, wherein the second width is greater than the first width, and the width of the resonator tapers along at least part of its length from the second width to the first width, wherein the dimensions of the resonator satisfy the equation $$\frac{L_{opt}}{w_1} = \frac{R - 0.1327(\phi - 0.3246)(\phi + 46.435)}{2(1-\phi)},$$

where $\phi=\psi=w_2/w_1$ and R is a free parameter between $-1000$ and 0, and wherein a resonator includes a semiconductor oxide and the thickness of the semiconductor oxide simultaneously satisfies a condition that a resonant frequency of the resonator remains fixed, independent of changes in temperature, and where $\psi$ is a tapering ratio of the first width and the second width; $L_{opt}$ is an optimal thickness of the semiconductor oxide; $w_1$ is the first width; and $w_2$ is the second width.

* * * * *